(12) United States Patent
Jeronimo Lopes

(10) Patent No.: US 9,022,019 B2
(45) Date of Patent: May 5, 2015

(54) MODULAR MULTIFUNCTIONAL SOLAR STRUCTURE

(76) Inventor: Amilcar Luis Jeronimo Lopes, Leiria (PT)

(*) Notice: Subject to any disclaimer, the term of this patent is extended or adjusted under 35 U.S.C. 154(b) by 1570 days.

(21) Appl. No.: 12/094,237

(22) PCT Filed: Mar. 30, 2007

(86) PCT No.: PCT/IB2007/051158
§ 371 (c)(1),
(2), (4) Date: Jan. 8, 2009

(87) PCT Pub. No.: WO2007/132363
PCT Pub. Date: Nov. 22, 2007

(65) Prior Publication Data
US 2009/0139565 A1 Jun. 4, 2009

(30) Foreign Application Priority Data
May 12, 2006 (PT) .......................... 103479

(51) Int. Cl.
| | |
|---|---|
| *H01L 31/048* | (2014.01) |
| *F24J 2/54* | (2006.01) |
| *F24J 2/04* | (2006.01) |
| *F24J 2/05* | (2006.01) |
| *F24J 2/26* | (2006.01) |

(Continued)

(52) U.S. Cl.
CPC ................. *F24J 2/541* (2013.01); *E06B 7/086* (2013.01); *E06B 9/386* (2013.01); *E06B 2009/2476* (2013.01); *F24J 2/0427* (2013.01); *F24J 2/055* (2013.01); *F24J 2/26* (2013.01); *F24J 2/38* (2013.01); *F24J 2002/0411* (2013.01);

(Continued)

(58) Field of Classification Search
USPC ........... 136/251, 246, 244; 126/271, 236, 569
See application file for complete search history.

(56) References Cited

U.S. PATENT DOCUMENTS 3,960,136 A * 6/1976 Moan et al. ................. 126/647
4,114,594 A   9/1978 Meyer
(Continued)

FOREIGN PATENT DOCUMENTS

DE  101 49 620 A1  4/2003
EP  1 632 786 A1   3/2006
(Continued)

OTHER PUBLICATIONS

Wenham, S.R., et al., "Low cost photovoltaic roof tile," Solar Energy Materials and Solar Cells, Elsevier Science Publishers, Amsterdam, NL, vol. 47, No. 1-4, Oct. 1997, pp. 325-337.

*Primary Examiner* — Gregory Huson
*Assistant Examiner* — Nikhil Mashruwala
(74) *Attorney, Agent, or Firm* — Sughrue Mion, PLLC

(57) ABSTRACT

The Modular Multifunctional Solar Structure is an innovative design in the field of Renewable Energy. This system, the schematic diagram of which is shown in FIG. 2, will collect the energy from the sunlight by using lightweight rotary thermal or bivalent photovoltaic solar receivers (A), sandwiched between Support Columns (B) which house the technical services. Because of its modular concept, this structure allows: an easy and progressive assembly in places exposed to the sun, with negative angles of down to 90°; and a microprocessor controlled solar tracking device, with alternative fixed or manually adjustable settings. These features solve the traditional problems associated with solar energy collectors, which include: a fixed position which is confined to specific angles, or a vertical layout, both of which are inefficient in terms of energy recovery; large dimensions and heavyweight collectors, which may need ungainly support structures; and wasted space.

4 Claims, 4 Drawing Sheets

Figure 1:
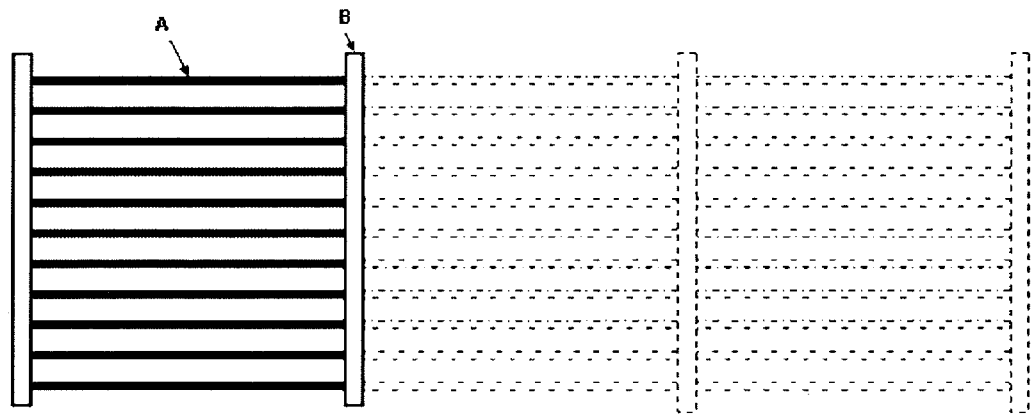

(51) Int. Cl.
    *F24J 2/38*     (2014.01)
    *H01L 31/052*     (2014.01)
    *H01L 31/042*     (2014.01)
    *H02S 20/25*     (2014.01)
    *E06B 7/086*     (2006.01)
    *E06B 9/386*     (2006.01)
    *E06B 9/24*     (2006.01)

(52) U.S. Cl.
    CPC ... *F24J2002/5468* (2013.01); *F24J 2002/5482* (2013.01); *H01L 31/052* (2013.01); *Y02B 10/12* (2013.01); *Y02B 10/22* (2013.01); *Y02E 10/44* (2013.01); *Y02E 10/47* (2013.01); *Y02E 10/50* (2013.01); *H02S 20/00* (2013.01); *H02S 20/25* (2014.12)

(56) References Cited

U.S. PATENT DOCUMENTS

| | | | |
|---|---|---|---|
| 4,143,640 A * | 3/1979 | Pierce | 126/600 |
| 4,198,955 A | 4/1980 | Dorbeck | |
| 4,219,008 A * | 8/1980 | Schultz | 126/592 |
| 4,303,059 A * | 12/1981 | Ford | 126/655 |
| 4,334,120 A * | 6/1982 | Yamano et al. | 136/248 |
| 4,365,617 A | 12/1982 | Bugash et al. | |
| 4,432,343 A * | 2/1984 | Riise et al. | 126/602 |
| 4,469,938 A | 9/1984 | Cohen | |
| 4,716,882 A * | 1/1988 | Ishida | 126/650 |
| 5,531,215 A * | 7/1996 | Schwarz | 126/578 |
| 6,029,656 A * | 2/2000 | Schwarz | 126/684 |
| 2002/0189662 A1 | 12/2002 | Lomparski | |
| 2010/0326424 A1* | 12/2010 | Bennett | 126/600 |

FOREIGN PATENT DOCUMENTS

| | | | | |
|---|---|---|---|---|
| FR | 2 779 275 A1 | 12/1999 | | |
| GB | 2096306 A * | 4/1981 | | F24J 3/02 |
| GB | 2 392 556 A | 3/2004 | | |
| JP | 2005-90889 A | 4/2005 | | |
| WO | 2005/090873 A1 | 9/2005 | | |

\* cited by examiner

MODULAR MULTIFUNCTIONAL SOLAR STRUCTURE

This application is a 371 of PCT/IB2007/051158 filed Mar. 30, 2007, claiming the priority of PT 103476 filed May 12, 2006 both of which are here are hereby incorporated by reference.

The Modular Multifunctional Solar Structure is an innovative design in the field of Renewable Energy. This system will collect the energy from the sunlight and will resolve the following problems experienced with existing solar energy collectors:

- a fixed position, which is confined to specific angles, or a vertical layout, both of which are inefficient in terms of energy recovery;
- large dimensions and heavyweight collectors, which may need ungainly support structures;
- wasted space;
- difficult to integrated as an architectural element in building design.

The Solar Structure (FIGS. 1 & 2) comprises a (variable) number of thermal or photovoltaic receiving elements (A) and support columns which house the technical services (B). With simple, progressive assembly this Solar Structure can be adapted to perform the following functions in addition to the primary function of thermal and/or photovoltaic energy recovery:

- Provide shading to buildings, windows, parking areas etc.
- Used in its tile function, the covering of gardens, passageways or other spaces.

The receivers can be mounted in fixed positions or with a mechanism designed to track the sun with azimuth or latitudinal positioning. It can be operated manually or fully automatically by microprocessor control in order to maximize energy collection. These qualities permit the Solar Structure to be installed with positive or negative angles, horizontally or even vertically, in any place exposed to the sun—for instance over balconies, patios, terraces, roves (even North facing ones), walls and dividers. In fact, installation in the vertical position even allows the units to be used instead of safety fences in areas such as balconies etc. This flexibility even allows the recuperation of solar energy in apartment blocks and office buildings.

Solar Receptors

Externally, these are formed by a transparent or translucent tube (2) of a circular, elliptical or other geometric form.

Depending on the use for which they are destined these may be either thermal or photovoltaic types. Both types can incorporate a Multifunction Blade (7), which permits them to be used as sunshades or tiles.

Figure 3:
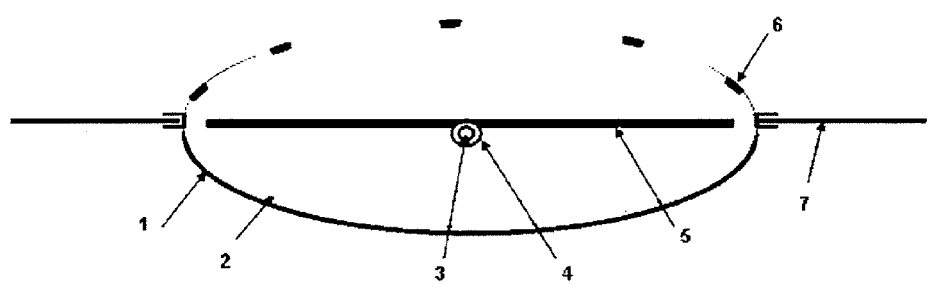
Figure 4:
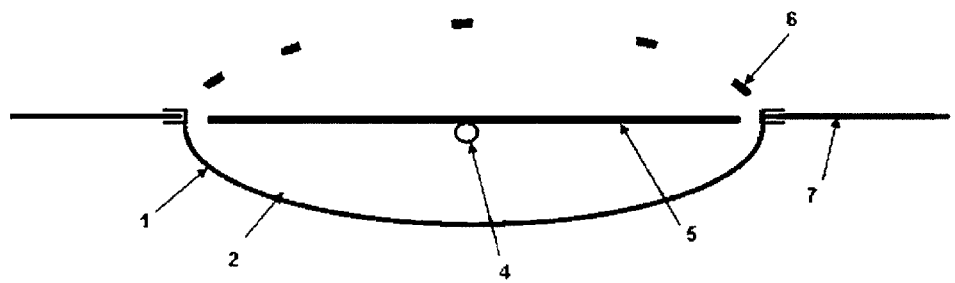

FIGS. 3 and 4 show the schematics of a thermal receptor and a photovoltaic receptor respectively.

Figure 2:
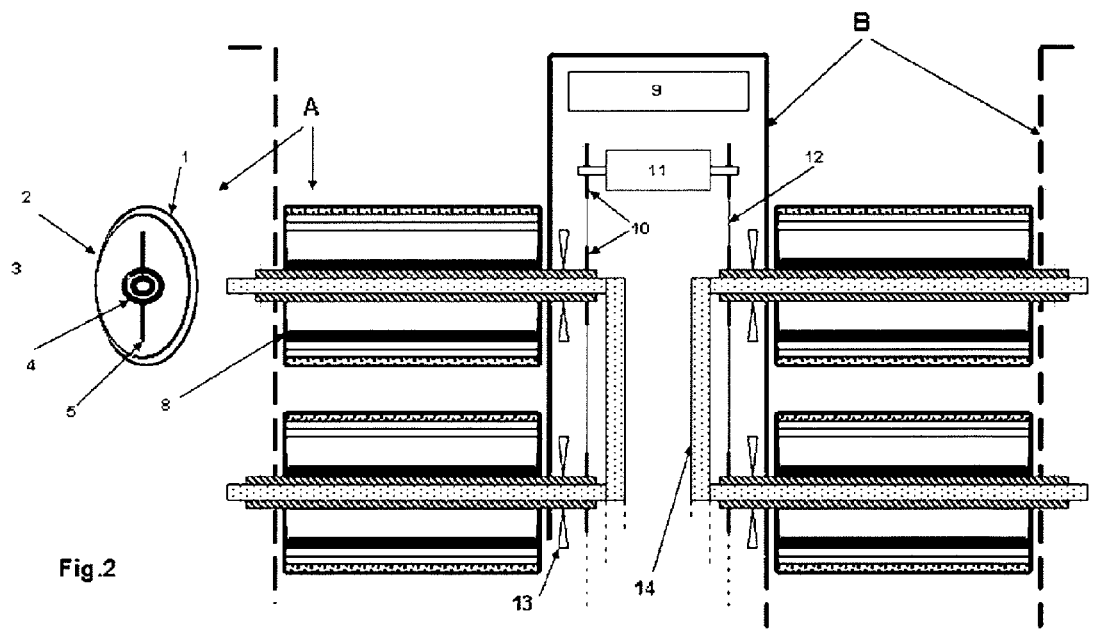

The following is a description of the individual parts shown on FIGS. 2, 3 and 4:

Metallic Cover (1)

This metallic cover is installed on the back half of the receptor and supports the Multifunction Blade (7).

External Tube (2)

On the thermal receptors this tube is mandatory and forms its external cover. It supports, protects and thermally isolates the internal parts form the exterior. This transparent tube is made of acrylic (PMMA) or other material which has the characteristics of being UV and weather resistant, has a low thermal conductivity and high transparency to infra red rays. Together with the two covers (8), it assures excellent thermal isolation (0.21 WmK as opposed to 1.2 WmK for glass).

The photovoltaic receptors may not have this external tube.

Fixed Internal Pipe (3)

This copper pipe, which is in contact with the rotary internal pipe (4), ensures transmission of the heat into the fluid that flows internally.

Photovoltaic receptors do not have this pipe.

Rotating Internal Pipe (4)

In the thermal receptors only, this pipe transfers the heat collected from the sun through the 'TiNOX selective coating'.

The pipe is made from copper, welded and laminated to the coating and transfers heat by contact to the fixed internal pipe.

For the photovoltaic receptors the same pipe (in copper or another suitable material) supports the photovoltaic cells and carries the wiring from the receptors and then into the support columns.

Regardless of which type of receptor is being considered, it is this tube that permits the receptors to turn in the Teflon bushes.

Support Blade (5)

This blade soldered to the rotary internal pipe (4) it is this that supports the Tinox® 'selective coating' (or alternative) or the photovoltaic cells.

Position Cells (6) and Microprocessor (9)

One set of five position sensing cells positioned in one of the external tubes (2) and a microprocessor (9) located in one of the technical support columns provide the information and calculations for tracking the sun in azimuth or latitude. The voltage in each of the silicon cells is compared and the values processed to give an error signal. The microprocessor analyses the deviation and drives the servo motor (11), the arm (10) and the rod (12) until symmetry is achieved.

For cloudy days, the microprocessor uses the last good data for a bright day or a predictive algorithm.

Multifunction Blade (7)

This blade is optional and can be fitted on either type of receptors. It has two distinct functions:

As a 'Sunshade' the blade is placed on either side of the metallic cover (1) and creates shadow to reduce the temperature of buildings, windows, car parks, etc. These blades overlap to produce shade without affecting the efficiency of the receptors.

Alternatively the receivers can be mounted with a 'tile blade', which moves to a closed or open position (FIG. 6.b) to protect the area underneath from the sun or rain. When precipitation occurs a moisture sensor located in the support columns sends information to the microprocessor, which automatically drives all the receptors to the closed position. If the rain stops, the receptors return to the normal solar position as calculated by the microprocessor. At night the solar receptors can be automatically sent to the closed position.

Receptors equipped with either tiles or sunshades can be manually controlled to the preferred position.

Covers (8)

Figure 7:
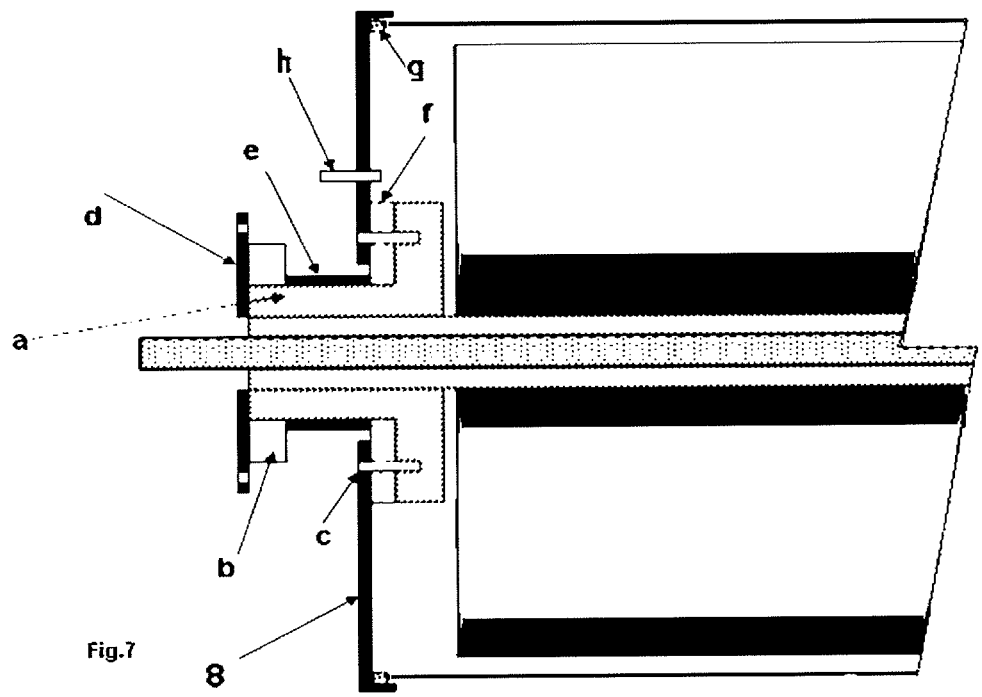

The tops of the receptors are closed by metal or plastic covers. For the thermal receptors, the thermal efficiency depends on the characteristics of this cover, which must ensure minimum internal losses. If a metal cover is used, it is also necessary to install a thermal rupture mechanism (FIG. 7.f) between the cover and the coupling box (FIG. 7.a). The covers also control the flow of heat within the receiver.

FIG. 7. details the metallic cover assembly and other parts of a thermal receptor. These parts are:

Coupling Box (a)

This part is welded to the rotating internal pipe (FIGS. 2, 3 (4)) and supports the cover (8).

Cushion (b)

This is made of Teflon® (with good thermal resistance and lubrication properties) and is represented in FIG. 2 (13). It supports the coupling box (a), which rotates around it.

Screws (c)

They fix the cover (8) to the coupling box (a).

Arm (d)

Shown in FIG. 2 (10), the arm is responsible for the movement of the receptors. It is actuated by the rods (12) connected to the servo motor (11).

Thermal Sleeve (e)

This assures the thermal isolation of the coupling box (a).

Thermal Gasket (f)

This cork gasket thermal isolation of the receptor and the internal heat flows. Note that the cover cannot touch the coupling box directly.

Relief Valve (h)

In order to ensure good thermal isolation it is important to ensure that there are no thermal losses between the interior and exterior of the receiver, especially through any free air flow. As previously mentioned, the internal thermal isolation must be complete. On the other hand, the smaller the quantity of air inside the receptor, the less thermal loss, caused by convective air flow, will occur. By means of a natural process it is possible to minimize the quantity of air inside the receptors by installing a one-way valve in one cover. When the internal air temperature rises, the volume of air increases and some air is expelled through the valve. As the internal air temperature falls, the volume cannot decrease so the internal pressure reduces. The greater the difference between the two temperatures, the lower will be the internal pressure and the lower will be the internal losses in the receptor. In the winter, when the temperature is at a minimum, the receptor efficiency is maximized.

In the case of the photovoltaic receptors, the covers are of simpler construction as air may flow freely through them and they need no isolation.

Figure 8:
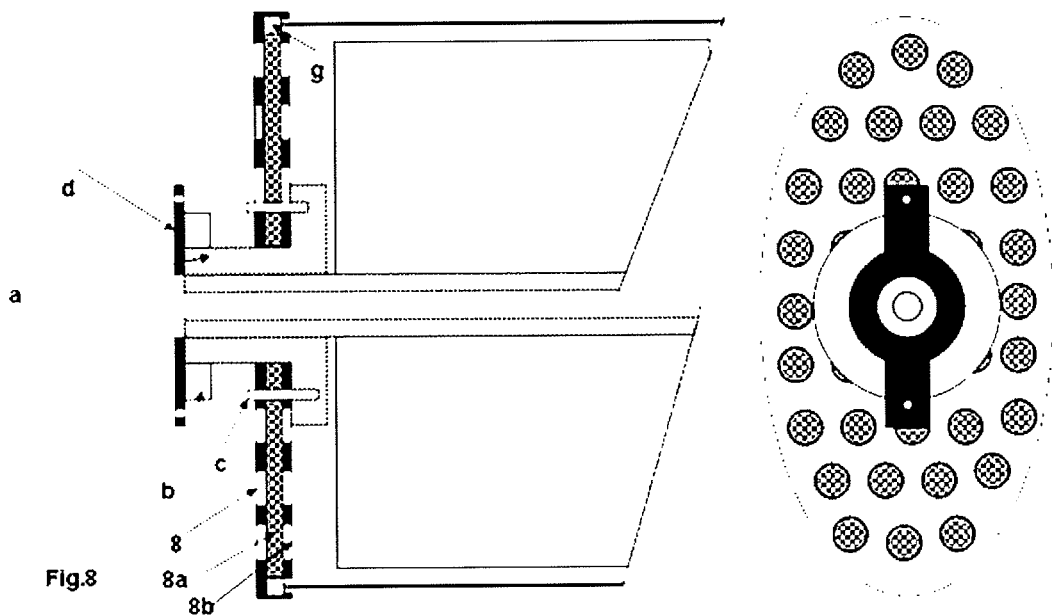

FIG. 8 shows a photovoltaic receptor with some common thermal receptor elements. Four elements have been omitted; the thermal sleeve (e); thermal gasket (f); relief valve (h) and the fixed internal pipe (3). Two new elements have been added; the dust filter (8a) and the new gasket with a hole in it.

The cover (8) and gasket (8b) ensure that the internal temperature is the same as ambient.

The gasket (8b) prevents dust from being deposited on the photovoltaic cells.

Support Columns (B)

The solar structure (FIGS. 1 and 2) shows the support columns (B), which house the technical services. As represented in FIG. 2, said support columns (B) present a hollow cross-section presenting a substantially closed perimeter confining a internal space adapted for housing technical means inside thereof in such a way that they result substantially occluded from the outside of said support columns (B). These columns form the supporting structure for both types of receptors and contain some of the elements necessary for driving them; servo motor (11); microprocessor (9); wiring, sensors and mechanical parts. In particular, as further represented in FIG. 2, said support columns (B) present a hollow cross-section adapted for housing the microprocessor (9), the motor (11) and mechanical means, such as the arm (10) and the rod (12), inside thereof and arranged to rotate said solar receptors, in such a way that they result substantially occluded from the outside of said support columns (B).

For the thermal receptors the support columns also contain the insulated pipes, safety valves, electro valves, air vents and pumps. According to a preferred embodiment, in the case of thermal and photovoltaic solar receptors, said support columns (B) present a hollow cross-section adapted for housing inside thereof at least one of insulated pipes, a relief valve, electro valves, air vents, pumps, wiring and sensors associated with respective type of solar thermal and photovoltaic receptors. This provided protection of such technical means from environment and weather hazards and greatly benefits the architectural integration of the multipurpose structure into buildings.

The support columns for the thermal receptors should have good internal insulation. Moreover, said support columns (B) present a hollow cross-section adapted for housing a pair of crosswise opposing cushions (b) inside thereof, whereby said cushions (b) are arranged for rotatably supporting a respective solar receptor so that each support column (B) can support a plurality of solar receptors on each side thereof. As best represented in FIG. 1, this provides for the possibility of modularly arranging a plurality of rows of solar receptors in parallel.

Figure 5:
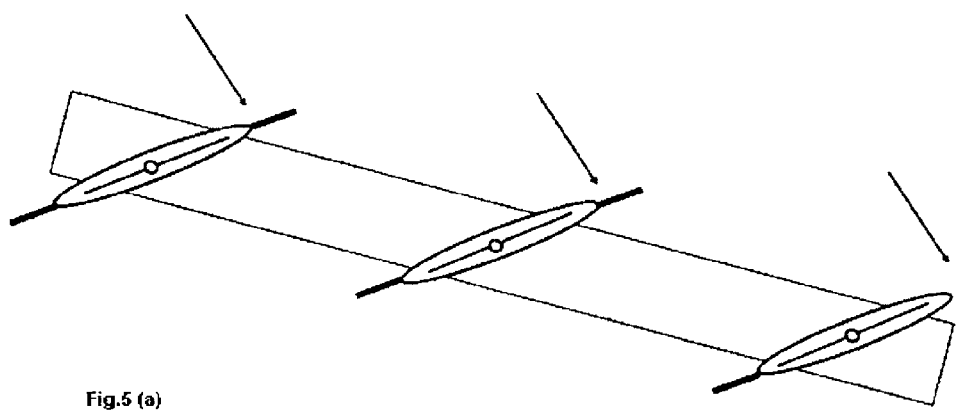
Figure 5:
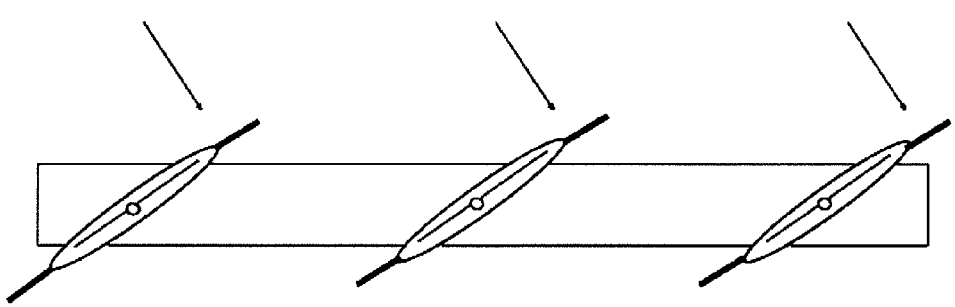
Figure 5:
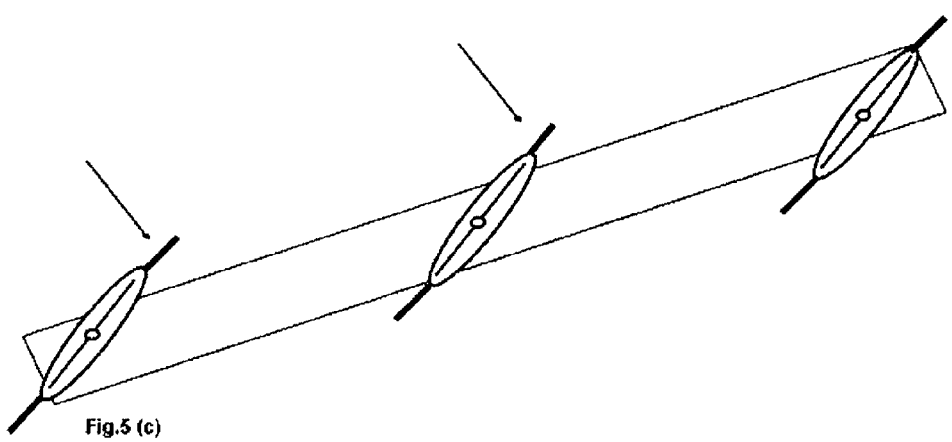
Figure 5:
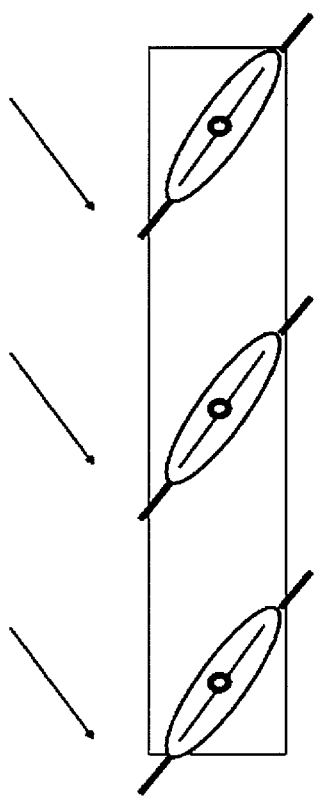
Figure 6:
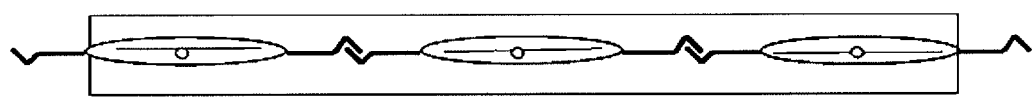
Figure 6:
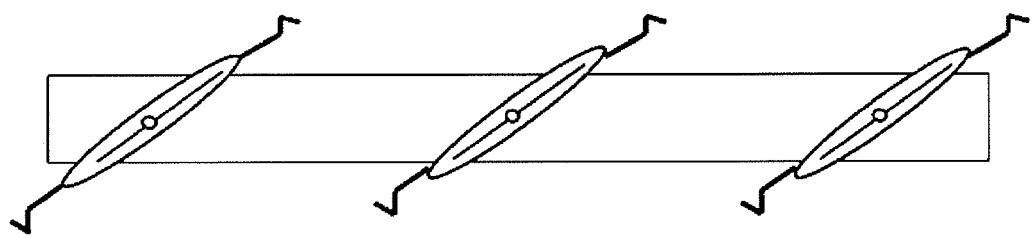

According to a preferred embodiment, and as best represented in FIGS. 5 and 6, said support columns (B) present a hollow cross-section with side faces facing said solar receptors whereby said side faces develop along at least most of the extension of said solar collecting surface so as to substantially occlude at least most of said solar receptors in said supporting direction. This further adds to the aforementioned benefit of protection of said solar receptors, in particular when rotating, from weather hazards such as strong winds, and of architectural integration.

The invention claimed is:

1. A modular multi-functional solar structure, comprising:
a plurality of independent support columns extending along a supporting direction;
a plurality of solar receptors arranged successively along said supporting direction and supported by and extending between respective support columns,
wherein each solar receptor is selected from the group consisting of a thermal solar receptor arranged to collect thermal energy, and a photovoltaic receptor arranged to produce electrical power;
wherein said support columns present a hollow cross-section presenting a substantially closed perimeter thereby confining an internal space adapted for housing technical means inside thereof in such a way that they result substantially occluded from the outside of said support columns;
wherein said support columns present the hollow cross-section adapted for housing a pair of crosswise opposing cushions inside thereof, whereby said cushions are arranged for rotatably supporting a respective solar receptor so that each support column can support the plurality of solar receptors on each side thereof;
wherein said support columns present the hollow cross-section adapted for housing a microprocessor, a motor and mechanical means inside thereof and arranged to rotate said solar receptors, in such a way that they result substantially occluded from the outside of said support columns.

2. A modular multi-functional solar structure according to claim 1,
wherein said support columns present the hollow cross-section with side faces facing said solar receptors;
wherein said side faces develop along at least most of the extension of said solar collecting surface so as to substantially occlude at least most of said solar receptors in said supporting direction.

3. A modular multi-functional solar structure according to claim 1,
   wherein said support columns present the hollow cross-section adapted for housing inside thereof at least one of insulated pipes, a relief valve, electro valves, wiring, sensors, air vents and pumps associated with respective type of solar thermal and photovoltaic receptors.

4. A modular multi-functional solar structure according to claim 1,
   wherein solar receptors present tile surfaces arranged at opposing edges of the solar collecting surfaces and adapted to provide additional shading projection upon spaces on the side opposite the solar collecting side.

\* \* \* \* \*